(12) United States Patent
Ushiyama et al.

(10) Patent No.: US 8,668,951 B2
(45) Date of Patent: *Mar. 11, 2014

(54) LIQUID MATERIAL ARRANGEMENT METHOD, COLOR FILTER MANUFACTURING METHOD, AND ORGANIC EL DISPLAY DEVICE MANUFACTURING METHOD

(75) Inventors: Yoshihiko Ushiyama, Nagano (JP); Tsuyoshi Kitahara, Nagano (JP); Yoichi Miyasaka, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 13/418,496

(22) Filed: Mar. 13, 2012

(65) Prior Publication Data

US 2012/0171357 A1 Jul. 5, 2012

Related U.S. Application Data

(63) Continuation of application No. 11/865,959, filed on Oct. 2, 2007, now Pat. No. 8,389,046.

(30) Foreign Application Priority Data

Oct. 5, 2006 (JP) .................... 2006-273858

(51) Int. Cl.
*C23C 16/52* (2006.01)

(52) U.S. Cl.
USPC ............................................................ 427/8

(58) Field of Classification Search
USPC ............................................................ 427/8
See application file for complete search history.

(56) References Cited

U.S. PATENT DOCUMENTS 6,707,579 B1 * 3/2004 Komiya et al. .............. 358/3.1

| 7,015,503 | B2 | 3/2006 | Seki et al. |
| 7,111,755 | B2 | 9/2006 | Koyama et al. |
| 7,214,959 | B2 | 5/2007 | Seki et al. |
| 7,273,801 | B2 | 9/2007 | Seki et al. |
| 2002/0044163 | A1* | 4/2002 | Shigemura ........................ 347/1 |
| 2002/0070990 | A1 | 6/2002 | Yamasaki et al. |
| 2003/0076609 | A1 | 4/2003 | Kawase |
| 2005/0083364 | A1* | 4/2005 | Billow ............................ 347/19 |
| 2005/0186403 | A1 | 8/2005 | Seki et al. |

FOREIGN PATENT DOCUMENTS

| JP | 2001-194519 A | 7/2001 |
| JP | 2002-148422 A | 5/2002 |
| JP | 2003-159787 A | 6/2003 |
| JP | 2004-090621 A | 3/2004 |
| WO | WO-99/48339 A1 | 9/1999 |

* cited by examiner

*Primary Examiner* — Michael Cleveland
*Assistant Examiner* — Austin Murata
(74) *Attorney, Agent, or Firm* — Global IP Counselors, LLP

(57) ABSTRACT

A liquid material arrangement method is a method for arranging a liquid material in a plurality of prescribed regions on a substrate by discharging the liquid material as a droplet from a nozzle. The liquid material arrangement method includes: performing a discharge information acquiring step for acquiring discharge information of the nozzle including a landing position and a discharge quantity of the droplet discharged from the nozzle by a nozzle check; performing a second pattern generating step for generating a second dot pattern, which is an arrangement pattern for arranging a prescribed number of droplets, by selecting at least one non-discharge dot from a first dot pattern, which is an arrangement pattern for arranging more droplets than the prescribed number of droplets, based on the discharge information; and performing a liquid material arranging step for arranging the liquid material in the prescribed regions based on the second dot pattern.

5 Claims, 16 Drawing Sheets

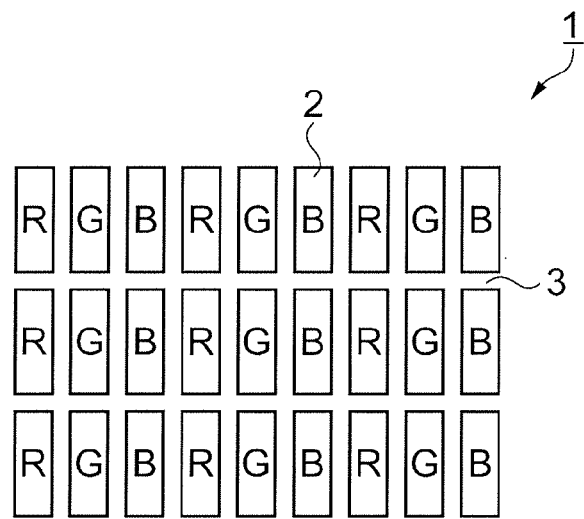
F I G. 1
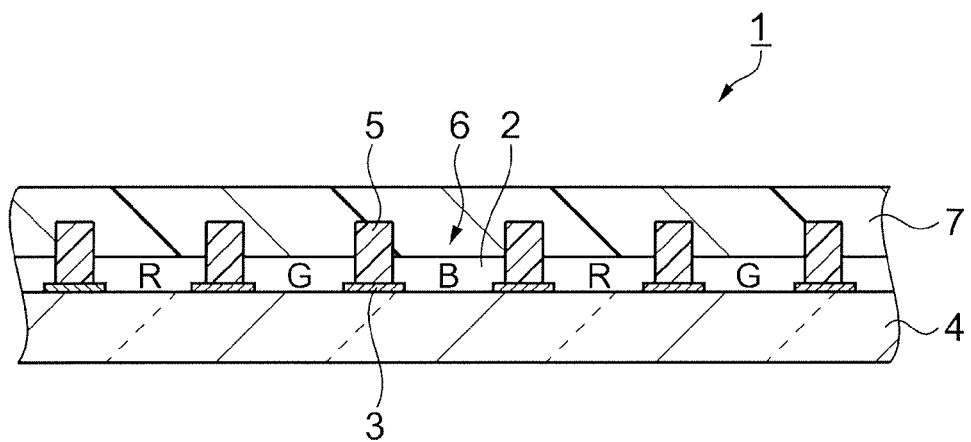
F I G. 2

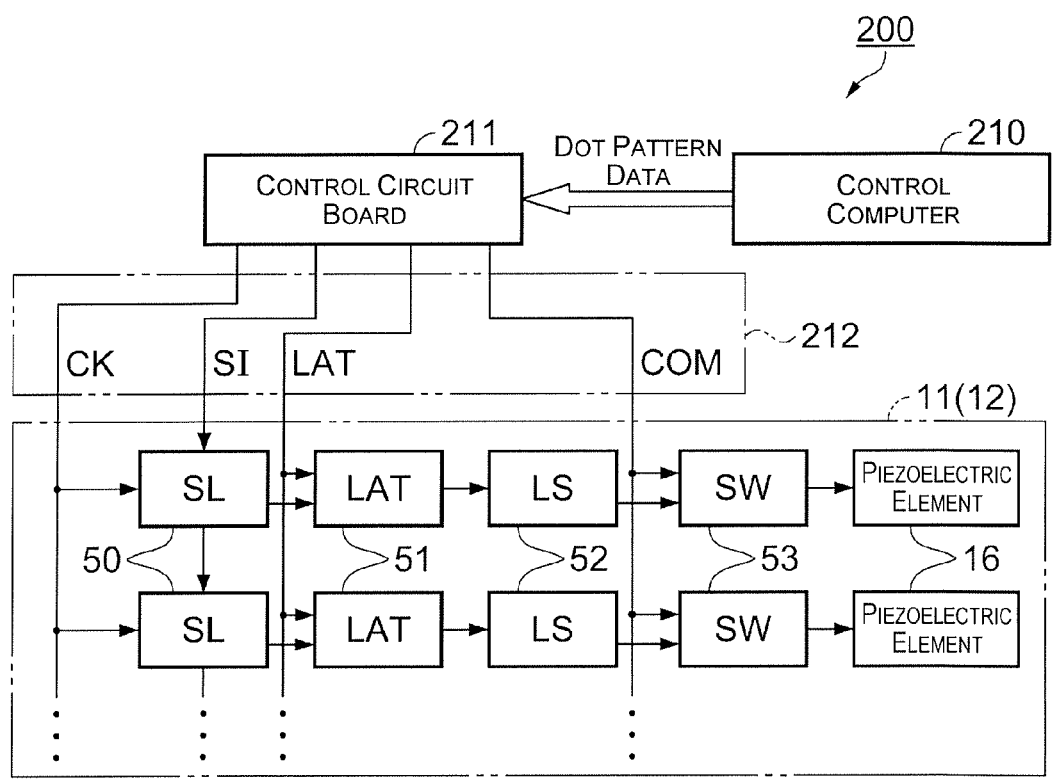
F I G. 5

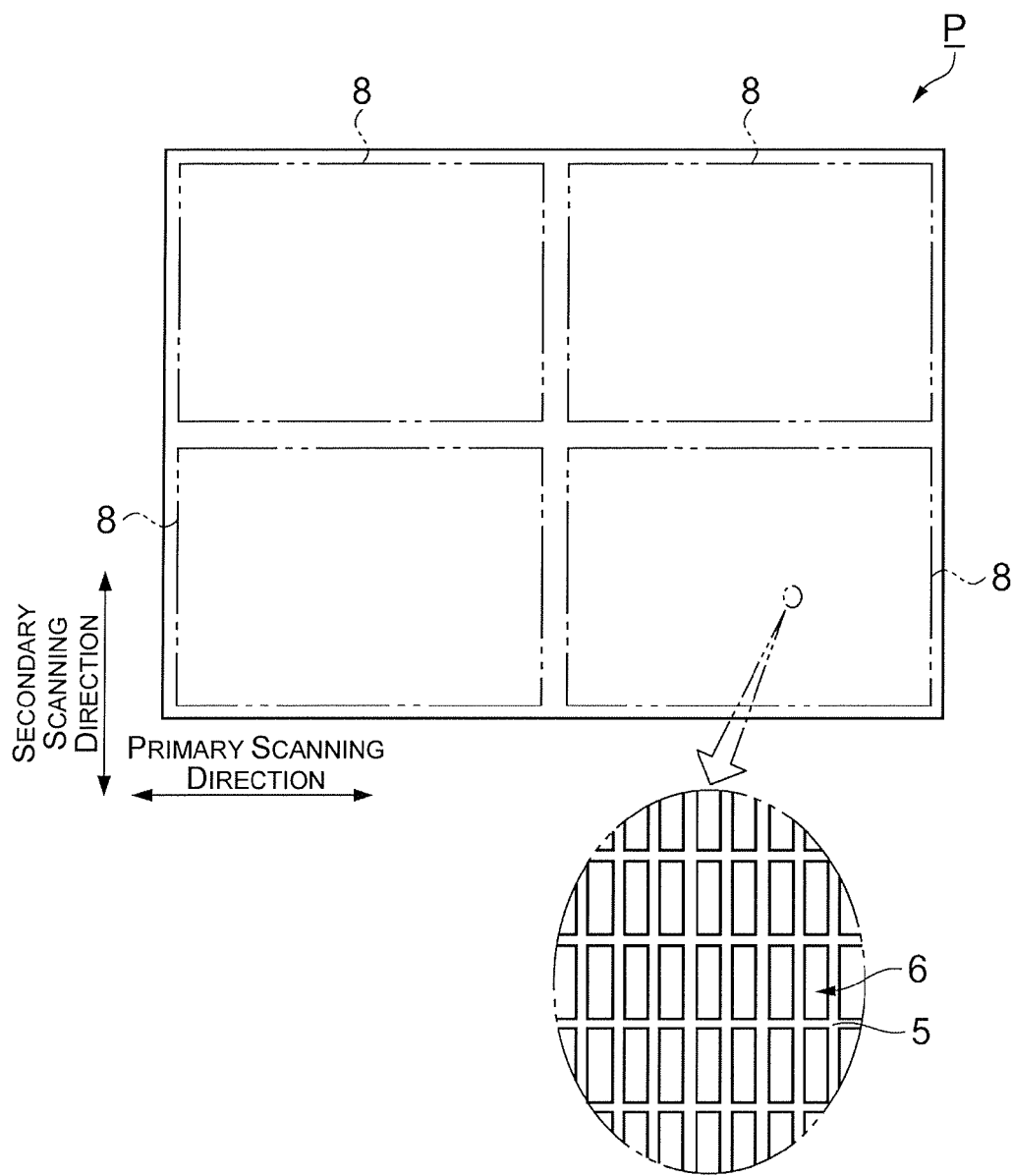
F I G. 8

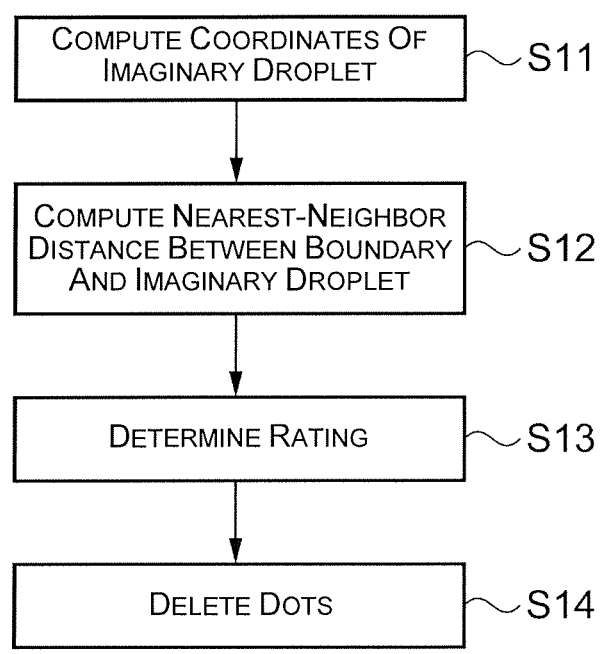
F I G. 10

| Dot No. | Corresponding Nozzle | Nearest-Neighbor Distance | Nearest-Neighbor Boundary | Rating |
|---|---|---|---|---|
| 1 | n32 | 17 | B1 | 3 |
| 2 | n32 | 30 | B3 | 12 |
| 3 | n32 | 30 | B3 | 12 |
| 4 | n32 | 24 | B2 | 8 |
| 5 | n13 | 20 | B1 | 5 |
| 6 | n13 | 30 | B1 | 12 |
| 7 | n13 | 31 | B2 | 13 |
| 8 | n13 | 21 | B2 | 6 |
| 9 | n23 | 26 | B1 | 10 |
| 10 | n23 | 35 | B2 | 15 |
| 11 | n23 | 25 | B2 | 9 |
| 12 | n23 | 15 | B2 | 1 |
| 13 | n33 | 19 | B1 | 4 |
| 14 | n33 | 29 | B1 | 11 |
| 15 | n33 | 32 | B2 | 14 |
| 16 | n33 | 22 | B2 | 7 |
| 17 | n14 | 22 | B1 | 7 |
| 18 | n14 | 32 | B1 | 14 |
| 19 | n14 | 29 | B2 | 11 |
| 20 | n14 | 19 | B2 | 4 |
| 21 | n24 | 16 | B4 | 2 |
| 22 | n24 | 16 | B4 | 2 |
| 23 | n24 | 16 | B4 | 2 |
| 24 | n24 | 16 | B4 | 2 |
F I G. 12
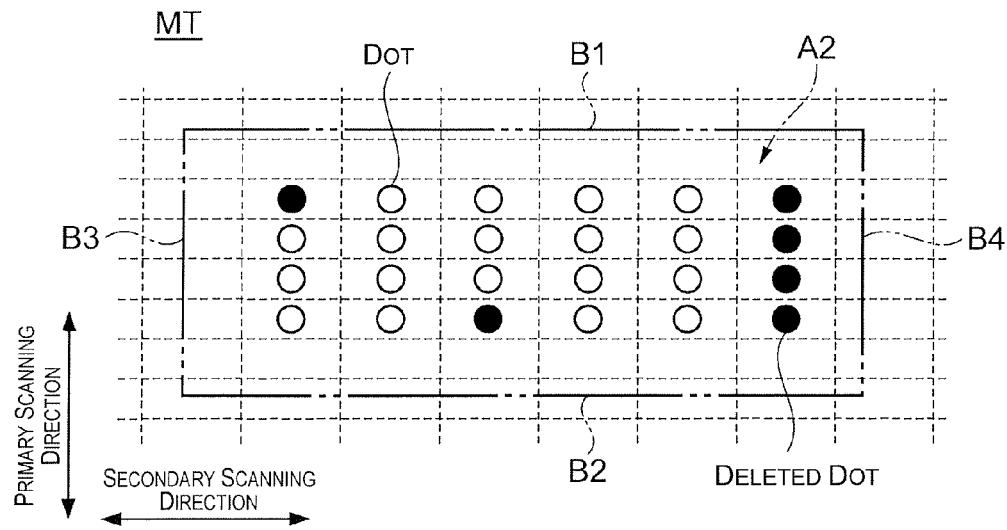
F I G. 13

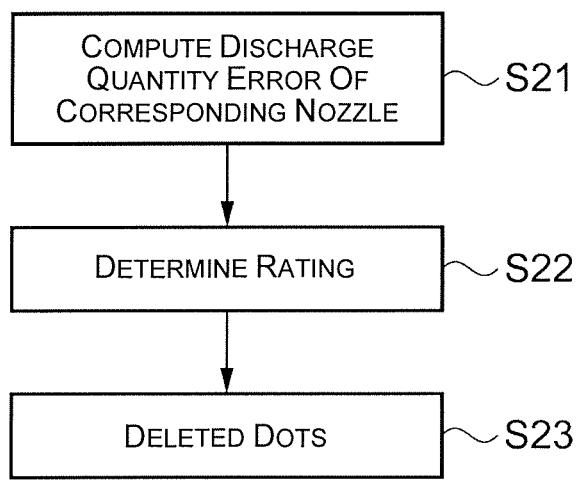
F I G. 14

| Dot No. | Corresponding Nozzle | Discharge Quantity Error | Rating |
|---|---|---|---|
| 1 | n32 | −0.14 | 3 |
| 2 | n32 | −0.14 | 3 |
| 3 | n32 | −0.14 | 3 |
| 4 | n32 | −0.14 | 3 |
| 5 | n13 | +0.15 | 2 |
| 6 | n13 | +0.15 | 2 |
| 7 | n13 | +0.15 | 2 |
| 8 | n13 | +0.15 | 2 |
| 9 | n23 | +0.08 | 5 |
| 10 | n23 | +0.08 | 5 |
| 11 | n23 | +0.08 | 5 |
| 12 | n23 | +0.08 | 5 |
| 13 | n33 | −0.11 | 4 |
| 14 | n33 | −0.11 | 4 |
| 15 | n33 | −0.11 | 4 |
| 16 | n33 | −0.11 | 4 |
| 17 | n14 | +0.22 | 1 |
| 18 | n14 | +0.22 | 1 |
| 19 | n14 | +0.22 | 1 |
| 20 | n14 | +0.22 | 1 |
| 21 | n24 | +0.03 | 6 |
| 22 | n24 | +0.03 | 6 |
| 23 | n24 | +0.03 | 6 |
| 24 | n24 | +0.03 | 6 |
F I G. 15
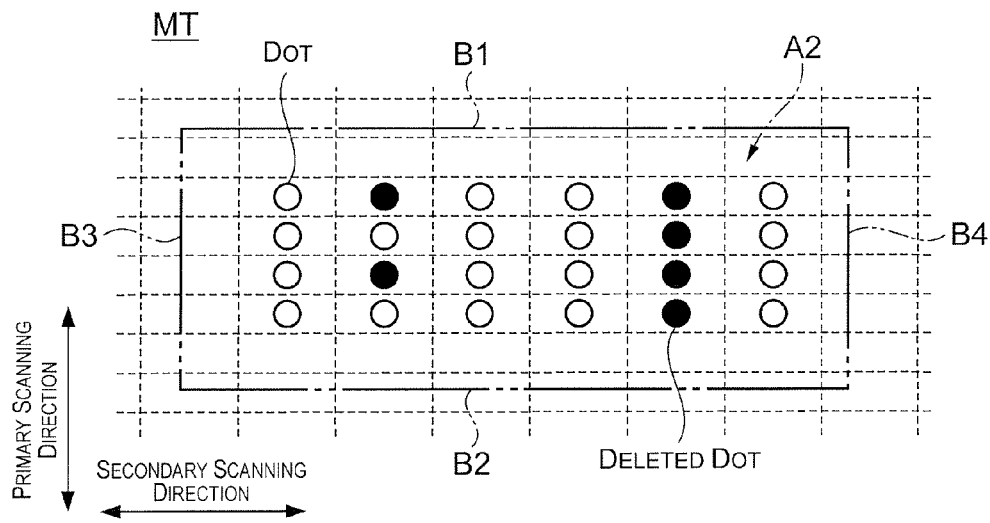
F I G. 16

| Dot No. | Corresponding Nozzle | Discharge Quantity Error | Rating |
|---|---|---|---|
| 1 | n32 | −0.14 | 2 |
| 2 | n32 | −0.14 | 2 |
| 3 | n32 | −0.14 | 2 |
| 4 | n32 | −0.14 | 2 |
| 5 | n13 | +0.15 | 3 |
| 6 | n13 | +0.15 | 3 |
| 7 | n13 | +0.15 | 3 |
| 8 | n13 | +0.15 | 3 |
| 9 | n23 | +0.08 | 5 |
| 10 | n23 | +0.08 | 5 |
| 11 | n23 | +0.08 | 5 |
| 12 | n23 | +0.08 | 5 |
| 13 | n33 | −0.11 | 4 |
| 14 | n33 | −0.11 | 4 |
| 15 | n33 | −0.11 | 4 |
| 16 | n33 | −0.11 | 4 |
| 17 | n14 | +0.22 | 1 |
| 18 | n14 | +0.22 | 1 |
| 19 | n14 | +0.22 | 1 |
| 20 | n14 | +0.22 | 1 |
| 21 | n24 | +0.03 | 6 |
| 22 | n24 | +0.03 | 6 |
| 23 | n24 | +0.03 | 6 |
| 24 | n24 | +0.03 | 6 |
F I G. 17
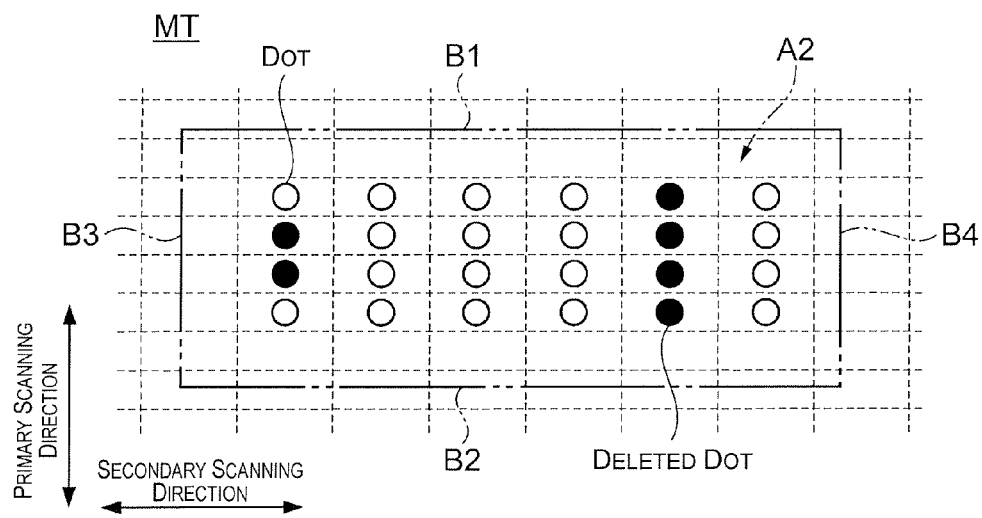
F I G. 18

| Dot No. | Corresponding Nozzle | Discharge Quantity Error | Rating B | Rating C | Total Rating |
|---|---|---|---|---|---|
| 1 | n32 | −0.14 | 2 | 2 | 4 |
| 2 | n32 | −0.14 | 2 | 2 | 4 |
| 3 | n32 | −0.14 | 2 | 2 | 4 |
| 4 | n32 | −0.14 | 2 | 2 | 4 |
| 5 | n13 | +0.15 | 2 | 1.5 | 3.5 |
| 6 | n13 | +0.15 | 2 | 1.5 | 3.5 |
| 7 | n13 | +0.15 | 2 | 1.5 | 3.5 |
| 8 | n13 | +0.15 | 2 | 1.5 | 3.5 |
| 9 | n23 | +0.08 | 3 | 1 | 4 |
| 10 | n23 | +0.08 | 3 | 1 | 4 |
| 11 | n23 | +0.08 | 3 | 1 | 4 |
| 12 | n23 | +0.08 | 3 | 1 | 4 |
| 13 | n33 | −0.11 | 2 | 1 | 3 |
| 14 | n33 | −0.11 | 2 | 1 | 3 |
| 15 | n33 | −0.11 | 2 | 1 | 3 |
| 16 | n33 | −0.11 | 2 | 1 | 3 |
| 17 | n14 | +0.22 | 1 | 1.5 | 2.5 |
| 18 | n14 | +0.22 | 1 | 1.5 | 2.5 |
| 19 | n14 | +0.22 | 1 | 1.5 | 2.5 |
| 20 | n14 | +0.22 | 1 | 1.5 | 2.5 |
| 21 | n24 | +0.03 | 3 | 2 | 5 |
| 22 | n24 | +0.03 | 3 | 2 | 5 |
| 23 | n24 | +0.03 | 3 | 2 | 5 |
| 24 | n24 | +0.03 | 3 | 2 | 5 |
F I G. 19
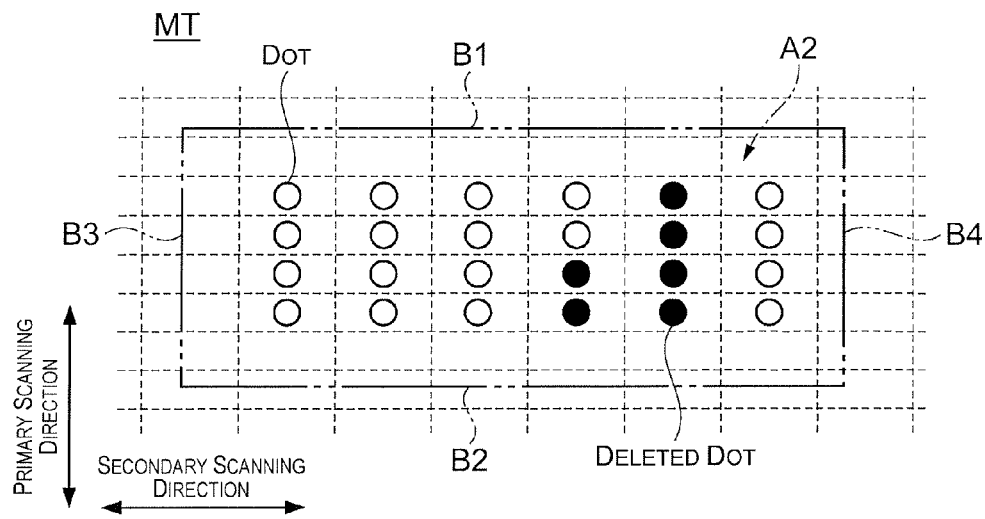
F I G. 20

| Dot No. | Corresponding Nozzle | Nearest-Neighbor Distance | Discharge Quantity Error | Rating A | Rating B | Rating C | Total Rating |
|---|---|---|---|---|---|---|---|
| 1 | n32 | 17 | −0.14 | 1 | 2 | 2 | 5 |
| 2 | n32 | 30 | −0.14 | 3 | 2 | 2 | 7 |
| 3 | n32 | 30 | −0.14 | 3 | 2 | 2 | 7 |
| 4 | n32 | 24 | −0.14 | 3 | 2 | 2 | 7 |
| 5 | n13 | 20 | +0.15 | 3 | 2 | 1.5 | 6.5 |
| 6 | n13 | 30 | +0.15 | 3 | 2 | 1.5 | 6.5 |
| 7 | n13 | 31 | +0.15 | 3 | 2 | 1.5 | 6.5 |
| 8 | n13 | 21 | +0.15 | 3 | 2 | 1.5 | 6.5 |
| 9 | n23 | 26 | +0.08 | 3 | 3 | 1 | 7 |
| 10 | n23 | 35 | +0.08 | 3 | 3 | 1 | 7 |
| 11 | n23 | 25 | +0.08 | 3 | 3 | 1 | 7 |
| 12 | n23 | 15 | +0.08 | 1 | 3 | 1 | 5 |
| 13 | n33 | 19 | −0.11 | 3 | 2 | 1 | 6 |
| 14 | n33 | 29 | −0.11 | 3 | 2 | 1 | 6 |
| 15 | n33 | 32 | −0.11 | 3 | 2 | 1 | 6 |
| 16 | n33 | 22 | −0.11 | 3 | 2 | 1 | 6 |
| 17 | n14 | 22 | +0.22 | 3 | 1 | 1.5 | 5.5 |
| 18 | n14 | 32 | +0.22 | 3 | 1 | 1.5 | 5.5 |
| 19 | n14 | 29 | +0.22 | 3 | 1 | 1.5 | 5.5 |
| 20 | n14 | 19 | +0.22 | 3 | 1 | 1.5 | 5.5 |
| 21 | n24 | 16 | +0.03 | 1 | 3 | 2 | 6 |
| 22 | n24 | 16 | +0.03 | 1 | 3 | 2 | 6 |
| 23 | n24 | 16 | +0.03 | 1 | 3 | 2 | 6 |
| 24 | n24 | 16 | +0.03 | 1 | 3 | 2 | 6 |

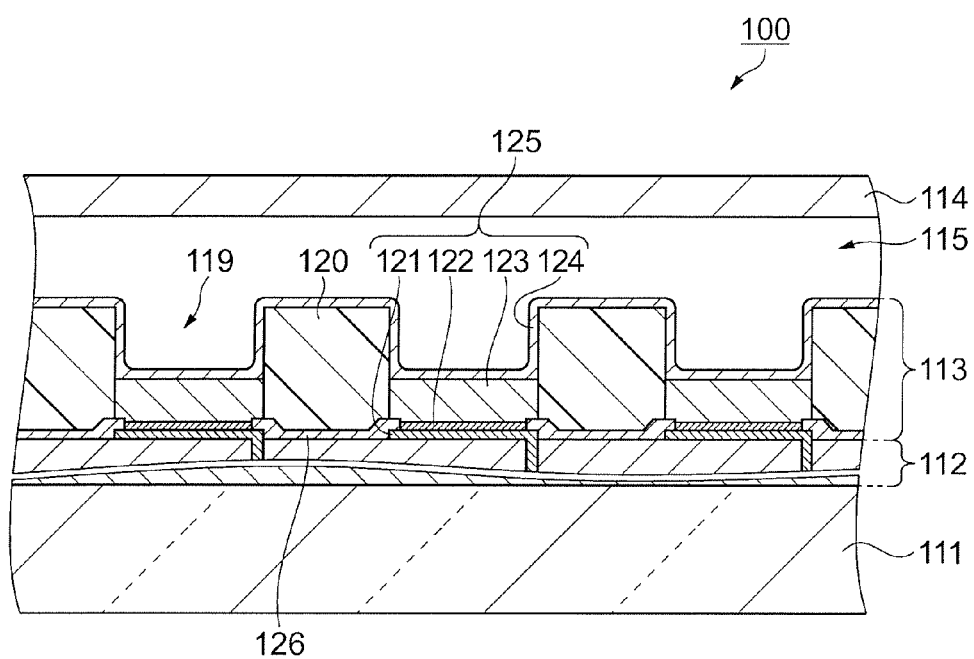
F I G. 23

LIQUID MATERIAL ARRANGEMENT METHOD, COLOR FILTER MANUFACTURING METHOD, AND ORGANIC EL DISPLAY DEVICE MANUFACTURING METHOD

CROSS-REFERENCE TO RELATED APPLICATIONS

This application is a continuation application of U.S. patent application Ser. No. 11/865,959, filed on Oct. 2, 2007, now U.S. Pat. No. 8,389,046. This application claims priority to Japanese Patent Application No. 2006-273858 filed on Oct. 5, 2006. The entire disclosures of U.S. patent application Ser. No. 11/865,959 now U.S. Pat. No. 8,389,046 and Japanese Patent Application No. 2006-273858 are hereby incorporated herein by reference.

BACKGROUND

1. Field of the Invention

The present invention relates to a liquid material arrangement method that uses a liquid droplet discharge method, and to a method for manufacturing a color filter and a method for manufacturing an organic EL display device that use the liquid material arrangement method.

2. Background Information

Coating techniques that use a droplet discharge method have recently received attention. For example, Japanese Laid-Open Patent Application Publication No. 2003-159787 discloses a method for manufacturing a color filter for a liquid crystal display device using a droplet discharge method. In this manufacturing method, droplets (a liquid material) that include a color material are discharged from micro nozzles in a droplet discharge head (hereinafter referred to as a head) that scans in relation to a substrate, the liquid material is arranged (drawn) in partitioned regions on the substrate and then cured by drying the arranged liquid material, and a color film that corresponds to a pixel is formed.

In view of the above, it will be apparent to those skilled in the art from this disclosure that there exists a need for an improved liquid material arrangement method. This invention addresses this need in the art as well as other needs, which will become apparent to those skilled in the art from this disclosure.

SUMMARY

The pattern in which the droplets are arranged on the substrate can be expressed as a so-called dot pattern (dot matrix pattern), and the dot pattern is converted to ON/OFF data (discharge data) for discharge that correspond to the relative positions (hereinafter referred to as scanning positions) of each nozzle with respect to the substrate, and discharge is controlled. Such a dot pattern is generated in advance according to a liquid material pattern to be formed on the substrate (in accordance with a corresponding pixel structure in the case of color filter manufacturing), or a nozzle alignment configuration or other hardware conditions.

However, the nozzle characteristics can vary from unit to unit, and such variation contributes to a reduction in the precision with which the liquid material is arranged. For example, an improper droplet flight direction causes droplets to land outside the partitioned region, and fluctuation in the discharged quantity causes the liquid material to be arranged in uneven amounts between partitioned regions.

The present invention was developed in order to overcome the problems described above. One object of the present invention is to provide a liquid material arrangement method capable of arranging a liquid material with high precision, and to provide a color filter manufacturing method and an organic EL display device manufacturing method that use the liquid material arrangement method.

According to one aspect of the present invention, a liquid material arrangement method is a method for arranging a liquid material in a plurality of prescribed regions on a substrate by discharging the liquid material as a droplet from a nozzle. The liquid material arrangement method includes: performing a discharge information acquiring step for acquiring discharge information of the nozzle including a landing position and a discharge quantity of the droplet discharged from the nozzle by a nozzle check; performing a second pattern generating step for generating a second dot pattern, which is an arrangement pattern for arranging a prescribed number of droplets, by selecting at least one non-discharge dot from a first dot pattern, which is an arrangement pattern for arranging more droplets than the prescribed number of droplets, based on the discharge information; and performing a liquid material arranging step for arranging the liquid material in the prescribed regions based on the second dot pattern.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 1 is a plan view showing the configuration of the color filter;

FIG. 2 is a sectional view showing the structure of the color filter;

FIG. 5 is a diagram showing the electrical configuration of the liquid material discharge device;

FIG. 8 is a plan view showing the state of the substrate when the liquid material is arranged;

FIG. 10 is a flowchart showing the routines for generating the second dot pattern;

FIG. 12 is a diagram showing the ratings for each dot;

FIG. 13 is a diagram showing the arrangement of dots in the second dot pattern;

FIG. 14 is a flowchart showing the routines for generating the second dot pattern;

FIG. 15 is a diagram showing the ratings for each dot;

FIG. 16 is a diagram showing the arrangement of dots in the second dot pattern;

FIG. 17 is a diagram showing the ratings for each dot;

FIG. 18 is a diagram showing the arrangement of dots in the second dot pattern;

FIG. 19 is a diagram showing the ratings for each dot;

FIG. 20 is a diagram showing the arrangement of dots in the second dot pattern;

FIG. 23 is a sectional view showing the relevant parts of the structure of the organic EL display device.

DETAILED DESCRIPTION OF THE PREFERRED EMBODIMENTS

Figure 3:
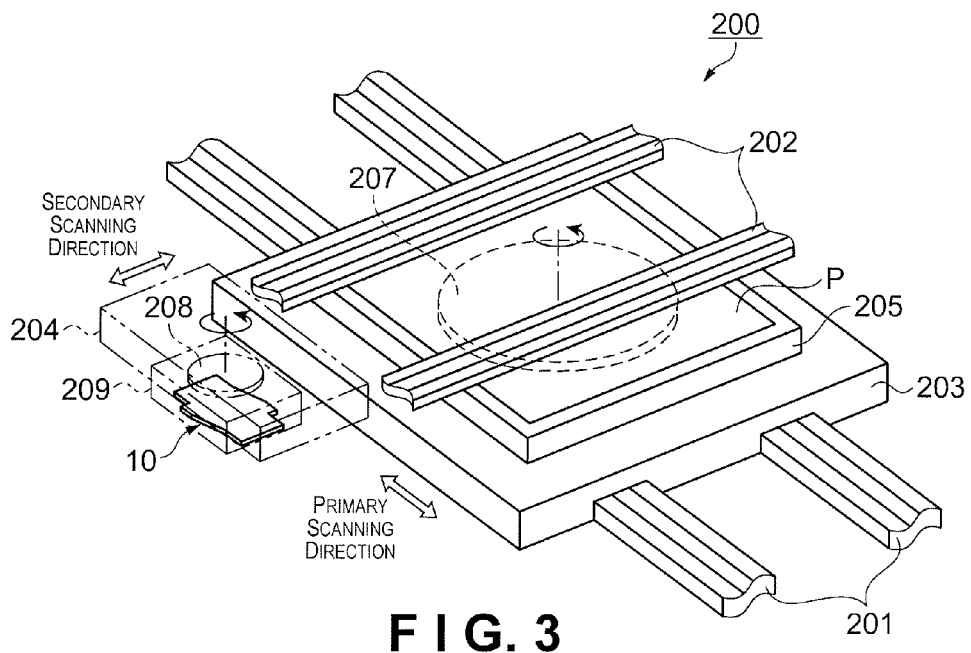
FIG. 3 is a perspective view showing the relevant parts of the liquid material discharge device.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. The reduction of the vertical and horizontal scale of members and components is sometimes shown differently than the actual scale for convenience in the drawings referenced in the description below.

First Embodiment

Structure of Color Filter

The structure of the color filter according to the present invention will first be described with reference to FIGS. 1 and 2. FIG. 1 is a plan view showing the configuration of the color filter. FIG. 2 is a sectional view showing the structure of the color filter.

The color filter 1 shown in FIGS. 1 and 2 is used in a color display panel, and has colored parts 2 that are formed so as to correspond to pixels of each color that include R (red), G (green), and B (blue) in the display panel; and light-blocking parts 3 that are formed in the regions between the colored parts 2. The colored parts 2 in the present embodiment have an arrangement and shape that correspond to a so-called striped pixel structure, but a different pixel structure may also be used. For example, a configuration may be adopted that is adapted to a structure that includes a color element other than R, G, and B, or to a delta structure.

The color filter 1 is provided with a glass transparent substrate 4, the light-blocking parts 3 are formed in a pattern on the substrate 4 by chromium or another opaque material, and banks 5 are formed in a pattern on the light-blocking parts 3 using a photosensitive resin or the like. The colored parts 2 are formed within partitioned regions 6 that are partitioned by the banks 5, and an overcoat layer 7 for forming a flat surface is formed by a resin or the like on the surface on which the colored parts 2 are formed. The plurality of partitioned regions 6 is all formed so as to have the same shape and size.

Mechanical Structure of Liquid Material Discharge Device

The mechanical structure of the liquid material discharge device that uses the liquid material arrangement method of the present invention will next be described with reference to FIGS. 3 and 4.

FIG. 3 is a perspective view showing the relevant parts of the liquid material discharge device. FIG. 4 is a plan view showing the layout of the head in the head unit.

The liquid material discharge device 200 shown in FIG. 3 is provided with a pair of guide rails 201 provided linearly, and a primary scanning stage 203 for moving in the primary scanning direction through the use of an air slider and a linear motor (not shown) provided inside the guide rails 201. A pair of guide rails 202 provided linearly so as to be orthogonal to the guide rails 201 is provided above the guide rails 201, and a secondary scanning stage 204 is provided for moving along the secondary scanning direction through the use of an air slider and a linear motor (not shown) provided inside the guide rails 202.

A stage 205 for mounting a substrate P as the discharge object is provided on the primary scanning stage 203. The stage 205 is configured so as to be capable of attaching and fixing the substrate P, and a reference axis in the substrate P can be properly aligned with the primary scanning direction and the secondary scanning direction through the use of a rotation mechanism 207.

The secondary scanning stage 204 is provided with a carriage 209 that is attached by suspension via a rotation mechanism 208. The carriage 209 is provided with a head unit 10 that is provided with a plurality of heads 11, 12 (see FIG. 4); a liquid material feeding mechanism (not shown) for supplying the liquid material to the heads 11, 12; and a control circuit board 211 (see FIG. 5) for electrically controlling the driving of the heads 11, 12.

Figure 4:
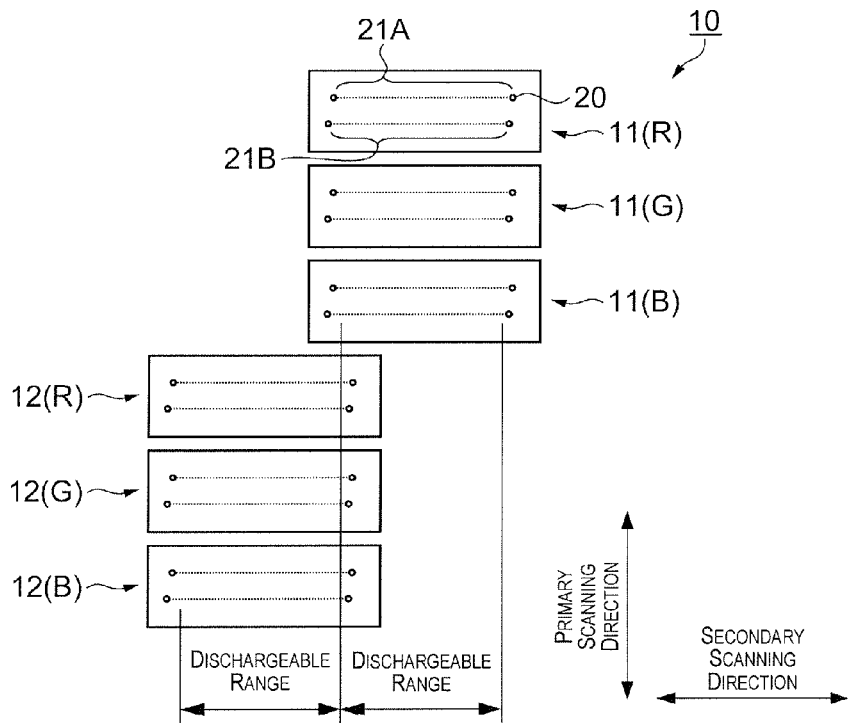
FIG. 4 is a plan view showing the layout of the head in the head unit.

As shown in FIG. 4, the head unit 10 is provided with the heads 11, 12 for discharging the liquid material that corresponds to R, G, and B from the nozzles 20, and the plurality of nozzles 20 in the heads 11, 12 is composed of nozzle groups 21A, 21B. The nozzle groups 21A, 21B each form lines at a prescribed pitch (180 DPI, for example), and are in a staggered relationship to each other. The arrangement direction of the nozzle groups 21A, 21B coincides with the secondary scanning direction.

Liquid chambers (cavities) communicated with the nozzles 20 in the heads 11, 12 are configured so that the volume thereof is varied by the driving of piezoelectric elements 16 (see FIG. 5). The droplets (liquid material) can be discharged from the nozzles 20 by supplying electric signals (drive signals) from the piezoelectric elements 16 to control the liquid pressure inside the cavities.

The nozzle groups 21A, 21B scan in the primary scanning direction with respect to the substrate P through the movement of the primary scanning stage 203, and ON/OFF control (hereinafter referred to as discharge control) of discharge for each nozzle 20 is performed, whereby the droplets (liquid material) can be arranged on the substrate P in positions along the scanning trajectory of the nozzles 20. The heads 11 and the heads 12 are offset from each other in the secondary scanning direction, and the nozzle groups 21A, 21B thereof are configured so as to complement the dischargeable ranges of each other and trace a continuous scanning trajectory at a constant pitch. Several nozzles 20 at the ends of the nozzle groups 21A, 21B are unused out of consideration for the specificity of the characteristics thereof.

The configuration of the liquid material discharge device is not limited by the embodiment described above. For example, a configuration may be adopted in which the arrangement direction of the nozzle groups 21A, 21B is tilted in relation to the secondary scanning direction, and the pitch of the scanning trajectory of the nozzles 20 is narrower than the pitch between the nozzles 20 in the nozzle groups 21A, 21B. The number or arrangement of the heads 11, 12 in the head unit 10 may also be appropriately varied. A so-called thermal scheme in which heating elements are provided to the cavities, for example, or another scheme may be employed as the drive scheme of the heads 11, 12.

Discharge Control Method

Figure 6:
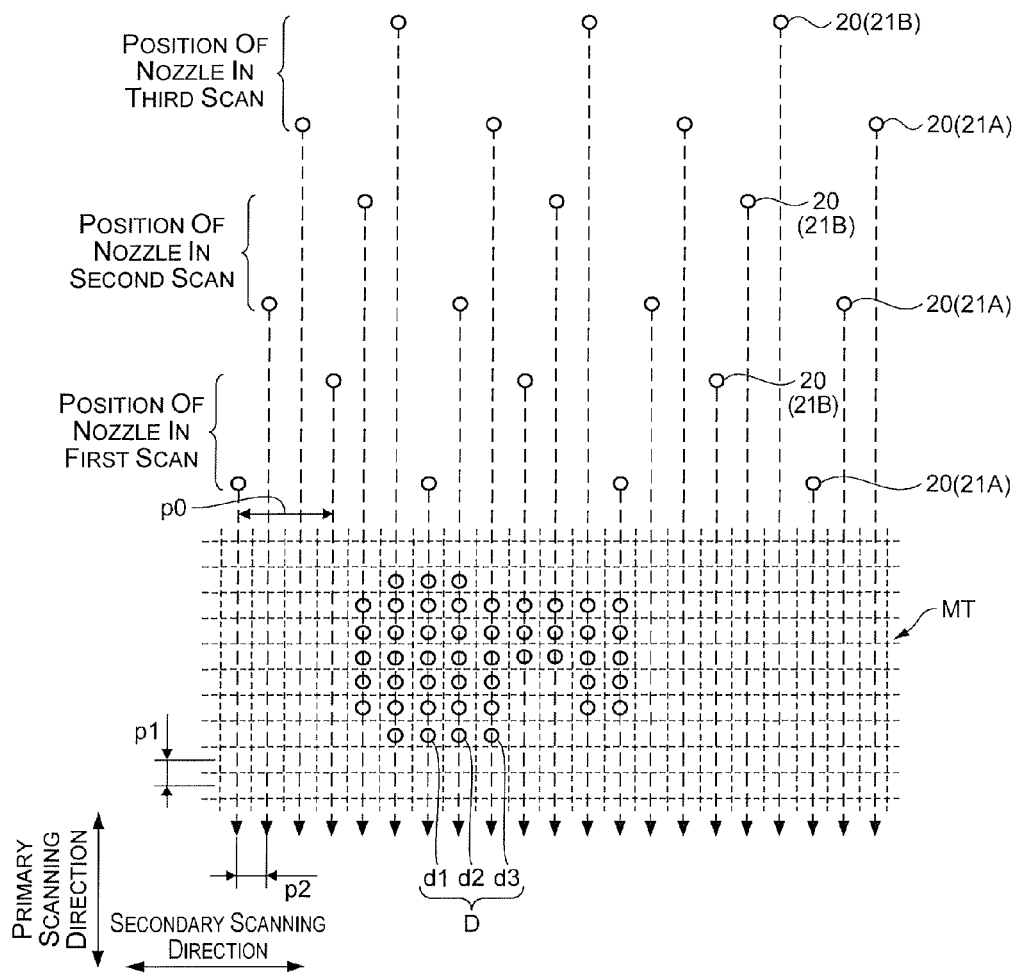
FIG. 6 is a diagram showing the relationship between the dot pattern and the arrangement of the nozzles.

The method for controlling discharge in the liquid material discharge device will next be described with reference to FIGS. 5 and 6.

FIG. 5 is a diagram showing the electrical configuration of the liquid material discharge device. FIG. 6 is a diagram showing the relationship between the dot pattern and the arrangement of the nozzles.

In FIG. 5, the liquid material discharge device 200 is provided with a control computer 210 for performing overall control of the entire device, and a control circuit board 211 for performing electrical drive control of the heads 11, 12. The control circuit board 211 is electrically connected with the heads 11, 12 via a flexible cable 212. The heads 11, 12 are also provided with a shift register (SL) 50, a latch circuit (LAT) 51, a level shifter (LS) 52, and a switch (SW) 53 that correspond to a piezoelectric element 16 that is provided to each nozzle 20 (see FIG. 2).

Discharge control in the liquid material discharge device 200 is performed in the following manner. Specifically, the control computer 210 first transfers dot pattern data (specifically described hereinafter) having a digitized arrangement pattern of the liquid material on the substrate P (see FIG. 1) to the control circuit board 211. The control circuit board 211 then decodes the dot pattern data to generate nozzle data as ON/OFF (discharge/no discharge) information for each nozzle 20. The nozzle data are converted to serial signals (SI), synchronized with a clock signal (CK), and transferred to the shift registers 50.

The nozzle data transferred to the shift registers 50 are latched at the timing at which the latch signals (LAT) are inputted to the latch circuits 51, and the nozzle data are converted by the level registers 52 to gate signals used for the switches 53. Specifically, when the nozzle data indicate "ON," the switches 53 open and drive signals (COM) are fed to the piezoelectric elements 16, and when the nozzle data indicate "OFF," the switches 53 are closed, and the drive signals (COM) are not fed to the piezoelectric elements 16. The liquid material is converted to droplets and discharged from nozzles 20 that correspond to "ON," and the discharged droplets (liquid material) are arranged on the substrate P.

As described above, discharge control of the liquid material discharge device 200 is performed based on the dot pattern (data). This dot pattern can be indicated as a pattern in which dots D are arranged in zones that are the discharge (arrangement) positions of the droplets (liquid material) in a matrix MT that has a primary scanning direction component and a secondary scanning direction component, as shown in FIG. 6. A dot D may indicate not only the mere presence of a discharge, but also a tone. For example, the quantity of droplets (discharged amount) or the discharge timing of the liquid material may be varied according to the tone.

The pitch: p1 of the primary scanning direction of the matrix MT herein is determined by the scanning speed and the discharge control period of the droplets (liquid material). The pitch: p2 of the secondary scanning direction of the matrix MT can be set to a whole multiple of the integer part of the pitch: p0 of the scanning trajectory of the nozzles 20 in a single scan. In the present embodiment, p2 is set to one third of p0, and the nozzles 20 are brought into the corresponding positions of all the dots D in the matrix MT to arrange the droplets (liquid material) by offsetting the positions of the nozzles 20 from each other in the secondary scanning direction every third scan.

The dots d1, d2, d3 adjacent to each other in the diagram are from the first scan, the second scan, and the third scan, respectively. These dots can all be correlated to the same nozzle, but the head is preferably moved a large amount in the secondary scanning direction during the scan so that the dots each correspond to a different nozzle 20 in order to spatially disperse the variation in characteristics (discharged amount, for example) between nozzles. There are various methods of offsetting the positions of the nozzles 20 (head) between a plurality of scans, and an appropriate method may be employed with consideration for the cycle time or the dispersion of characteristic variations between nozzles or heads. Although not employed in the present embodiment, a method in which the positions of the nozzles 20 in the secondary scanning direction are superposed in a plurality of scans enables a dot D in a single row (along the primary scanning direction) to be allocated to a plurality of nozzles 20.

The method for manufacturing a color filter (the liquid material arrangement method) according to the present invention will next be described with reference to FIGS. 7 through 9.

Figure 7:
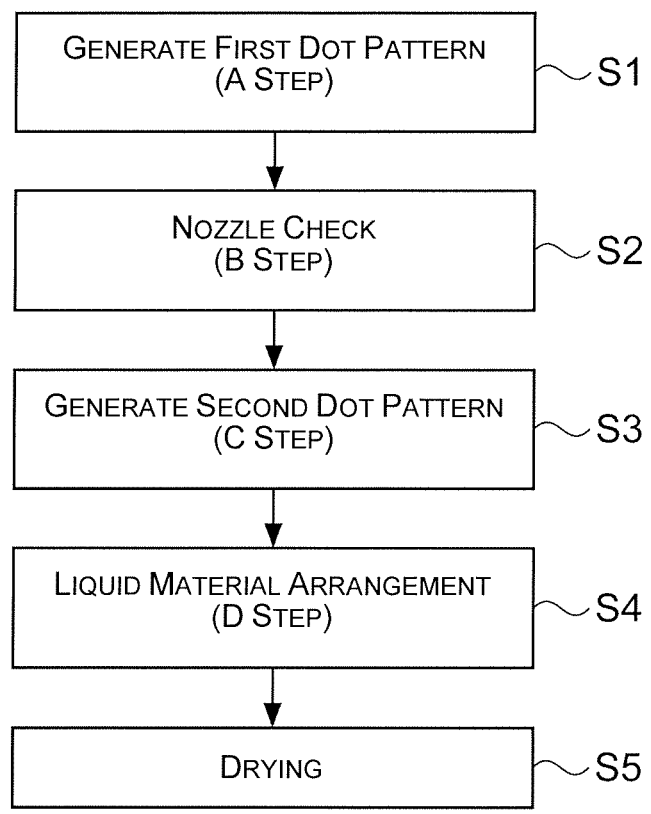
FIG. 7 is a flowchart showing the steps for forming the colored parts in the color filter.

FIG. 7 is a flowchart showing the steps for forming the colored parts in the color filter. FIG. 8 is a plan view showing the state of the substrate when the liquid material is arranged. FIG. 9 is a diagram showing the relationship between the nozzles and the first dot pattern.

The colored parts 2 (see FIGS. 1 and 2) of the color filter 1 (see FIGS. 1 and 2) are formed by preparing a liquid material that includes color material corresponding to R, G, and B and arranging the color material on the substrate using the liquid material discharge device 200 (see FIG. 3). As shown in FIG. 8, four individual regions 8 that are regions that individually correspond to a color filter 1 are set in the substrate P on which the liquid material is arranged, and a group of partitioned regions 6 is formed in each individual region 8 by banks 5. The substrate P is mounted on the stage 205 (see FIG. 3) in the present embodiment with the long direction of the partitioned regions 6 in the secondary scanning direction and the short direction of the partitioned regions 6 in the primary scanning direction.

The liquid material is arranged in the partitioned regions 6 as prescribed regions that are partitioned by the banks 5, but a lyophilizing treatment on the exposed surface of the substrate P in the partitioned regions 6, and a water-repellant treatment on the surfaces of the banks 5 are preferably performed in advance so that the liquid material is properly patterned according to the partitioned regions 6. Such treatments can be performed by plasma treatment with oxygen or a fluorocarbon, for example. The formation of the banks 5 is a preferred embodiment for creating a highly precise pattern of the liquid material, but such physical partitions are not necessarily needed in order to define the partitioned regions.

The first dot pattern is first created prior to arrangement of the liquid material (step S1 of FIG. 7). Specifically, step S1 constitutes the A step (the first pattern generating step) of the present invention. The first dot pattern is the basis for generating a dot pattern (second dot pattern) for discharge control, and has a configuration such as the one shown in FIG. 9. In the diagram, the empty circles each represent a dot, and imaginary partitioned regions A1, A2, A3, . . . indicate regions that correspond to the partitioned regions 6 when the matrix MT is superposed on the substrate P.

The first dot pattern in the present embodiment has 24 (prescribed number a) dots (an example of a first prescribed number of dots) that are set in an arrangement having four rows and six columns in the substantial center of each imaginary partitioned region A1, A2, A3, . . . of the same color. These dots are correlated to nozzles n11, n12, . . . based on the positional relationship with the scanning trajectory of the nozzles. Specifically, discharge of droplets (liquid material) based on each nozzle is performed by the corresponding nozzle, and the discharges droplets (liquid material) are arranged in the corresponding position for each dot in the substrate P (see FIG. 8).

In the first dot pattern, since the number of dots set for each imaginary partitioned region exceeds 18, which is the number that corresponds to the appropriate arranged quantity of droplets (liquid material), overflow from the partitioned regions 6 can occur when droplets (liquid material) are discharged based on the unmodified first dot pattern. Therefore, processing is performed for deleting six (prescribed number b) dots (an example of a second prescribed number of dots), which is the number of extra dots, from the 24 (prescribed number a) dots, a second dot pattern for discharge control must be generated.

A detailed description will be given hereinafter, but an indicator that is based on the discharge information of the nozzles must be determined in order to generate the second dot pattern. A nozzle check for acquiring the discharge information of the nozzles is therefore performed before the second dot pattern is generated (step S2 of FIG. 7). Specifically, step S2 constitutes the B step (the discharge information acquiring step) of the present invention. The nozzle discharge information is information indicating the discharge characteristics, which can be indicated by the discharge quantity, the accuracy (arrangement position accuracy) of the landing position, and other information, for example.

The nozzle check in the present embodiment is performed by discharging droplets (liquid material) from a nozzle to a paper, capturing an image of the landing mark on the paper, and analyzing the image. The deviance from the ideal position of the landing mark is thereby acquired as information relating to the accuracy of the arrangement position.

When the nozzle check (step S2) is completed, the first dot pattern is processed based on the acquired nozzle discharge information, and the second dot pattern is generated (step S3 of FIG. 7). This processing is performed for each unit of 24 dots set for each imaginary partitioned region A1, A2, A3, . . . , whereby 6 (prescribed number b) dots are deleted from the 24 (prescribed number a) dots, and a second dot pattern having 18 dots per imaginary partitioned region is generated (see FIG. 13). Specifically, step S3 constitutes the C step (the dot deleting step) of the present invention.

Droplets (liquid material) are then discharged to the partitioned regions 6 based on the second dot pattern (step S4 of FIG. 7). An amount of droplets (liquid material) corresponding to 18 dots is thereby arranged in the partitioned regions 6. Specifically, step S4 constitutes the D step (the liquid material arranging step) of the present invention.

The colored parts 2 (see FIGS. 1 and 2) are then formed by drying the liquid material that was arranged in the partitioned regions 6 (step S5 of FIG. 7). A detailed description will be given hereinafter, but the second dot pattern is made suitable based on the nozzle discharge information, and the colored parts 2 corresponding to the partitioned regions 6 are formed with satisfactory precision.

The nozzle check (step S2) and the generation of the second dot pattern (step S3) performed based on the results of the nozzle check are preferably performed periodically when the substrate P as a unit is replaced. The discharge information of the nozzles may also change according to acquired circumstances, e.g., contamination of the flow channels with air, the nozzle maintenance history, and other circumstances, and the discharge information is used to rapidly adapt to such changes.

Generation of Second Dot Pattern

Generation of the second dot pattern will next be described in detail with reference to FIGS. 9 through 13.

Figure 11A:
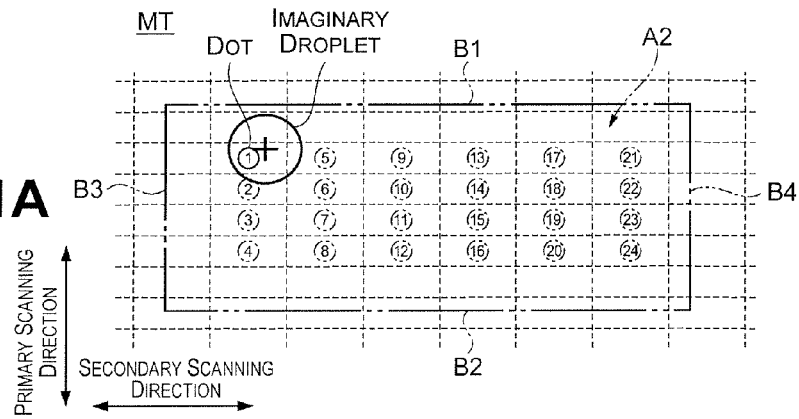
FIGS. 11A through 11C are diagrams showing examples of the process for generating the second dot pattern.
Figure 11B:
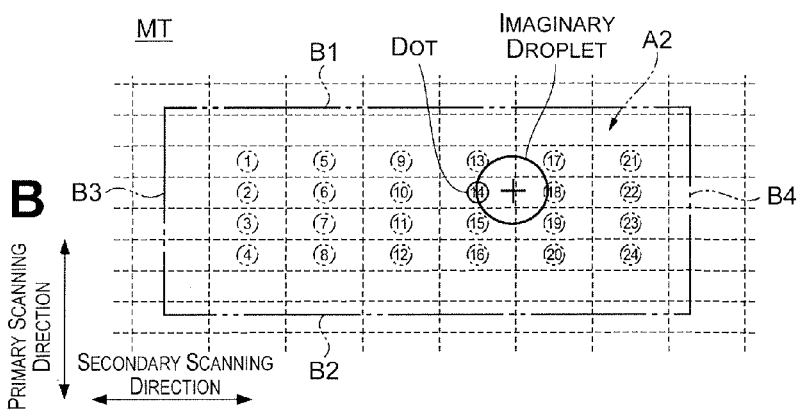
Figure 11C:
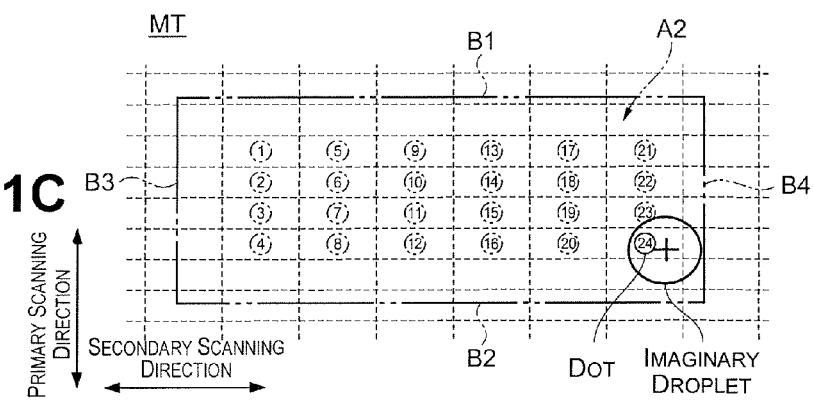

FIG. 10 is a flowchart showing the routines for generating the second dot pattern. FIGS. 11A to 11C are diagrams showing process for generating the second dot pattern. FIG. 12 is a diagram showing the ratings for each dot. FIG. 13 is a diagram showing the arrangement of dots in the second dot pattern. The numbers written in the dots in FIGS. 11A to 11C are used for convenience in identifying each dot.

Figure 9:
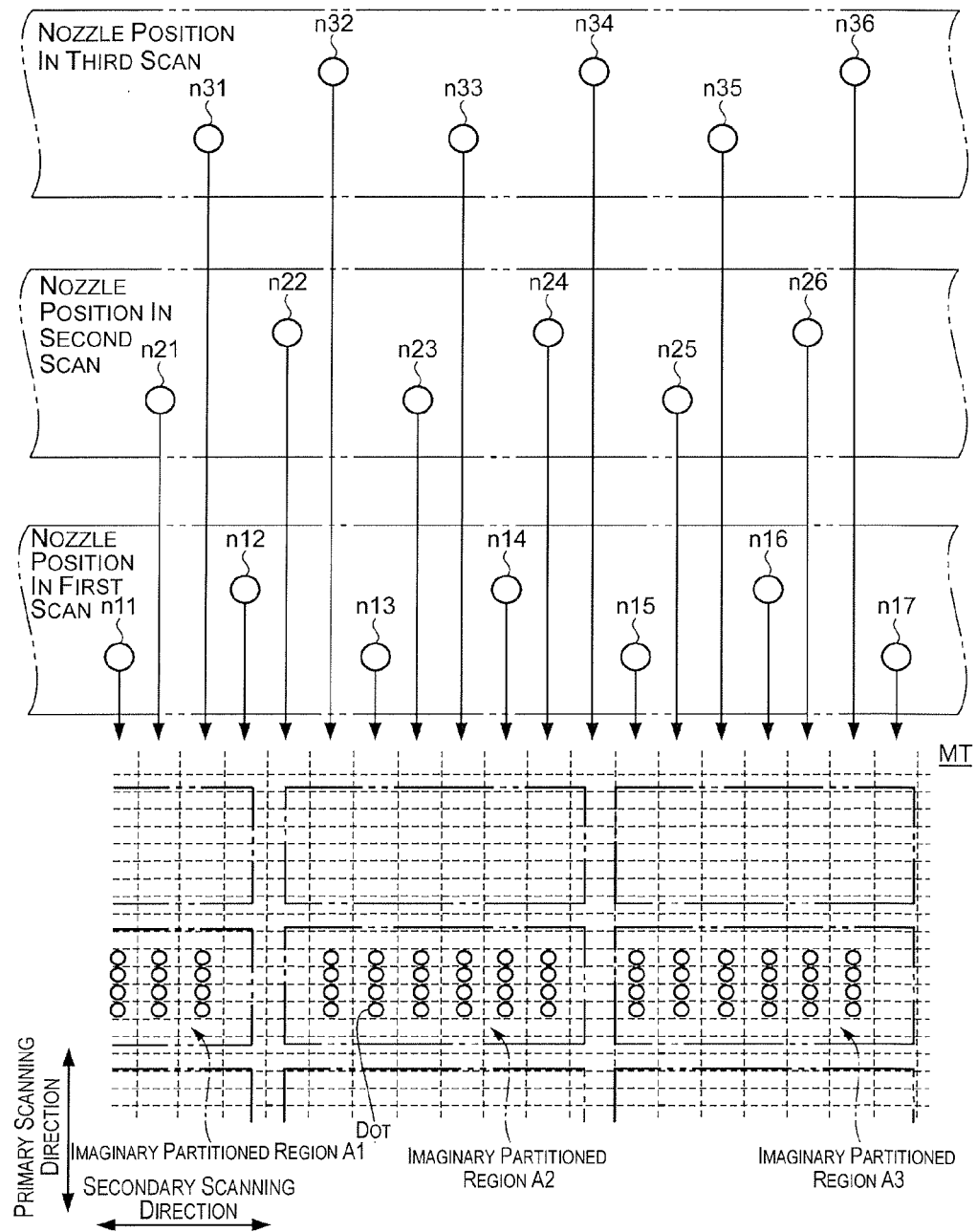
FIG. 9 is a diagram showing the relationship between the nozzles and the first dot pattern.

The processing for generating the second dot pattern is performed in accordance with the flowchart of FIG. 10 for each 24-dot unit set according to each imaginary partitioned region A1, A2, A3, . . . based on the first dot pattern shown in FIG. 9. This processing is actually performed automatically using a computer, and the computer reads the first dot pattern (data) generated in step S1 and the discharge information of the nozzles obtained in step S2, and executes the processing shown in FIG. 10.

In the first step S11, the coordinates of the landing positions (estimated arrangement position) of corresponding imaginary droplets are computed for each dot. The term "imaginary droplets" refers to an imaginary image of the state of the droplets when discharge is assumed to be performed based on the dots, and FIGS. 11A through 11C show the imaginary droplets that correspond to the $1^{st}$, $14^{th}$, and $24^{th}$ dots, respectively. The imaginary droplet landing position is the center position (indicated by a plus sign in the diagrams) of the imaginary droplet when the droplet lands on the substrate.

The imaginary droplet landing positions ideally coincide with the center positions of the dots, but some misalignment actually occurs due to the effects of the accuracy of the arrangement position of the corresponding nozzle. Specifically, the imaginary droplet landing position is acquired by performing a coordinate adjustment based on the accuracy of the arrangement position of the corresponding nozzle using the coordinates of the center position of the dot as a reference.

In the subsequent step S12, the nearest-neighbor distance between the imaginary droplets corresponding to each dot and the boundaries of the imaginary partitioned regions A1, A2, A3, . . . is calculated based on the coordinate information acquired in step S11. For example, in the case of the imaginary partitioned region A2, the nearest-neighbor distances between the imaginary droplet and the boundaries B1 through B4 are as shown in FIG. 12, and the nearest adjacent boundary or distance varies according to the set position of the dot or the accuracy of the nozzle arrangement position.

In the subsequent step S13, a rating evaluation for each dot is performed based on the nearest-neighbor distance acquired in step S12. The rating is a numerical representation of the degree of discrepancy (estimated error) in the arrangement accuracy when discharge is assumed to be performed based on the dot, and the rating corresponds to the indicator in the present invention. A small nearest-neighbor distance indicates a high risk of the discharged droplets landing outside the partitioned region, and the rating of a dot is lower (the indicator is higher) the smaller the nearest-neighbor distance is (see FIG. 12).

In the subsequent step S14, six (prescribed number b) dots for which the rating is determined to be relatively small are deleted from the 24 (prescribed number a) dots in the imaginary partitioned regions A1, A2, A3, . . . , and the second dot pattern is generated. When droplets (liquid material) are arranged based on the second dot pattern, since discharging of droplets for which the landing position is predicted to be close to the boundary of the prescribed region is limited with priority, the droplets can be appropriately prevented from occurring outside the partitioned region.

In the case of the imaginary partitioned region A2, The $1^{st}$, $12^{th}$, and $21^{st}$ through $24^{th}$ dots are the corresponding dots when six dots are selected in order of the smallest rating (highest indicator) with reference to FIG. 12. The second dot pattern that is generated when these dots are deleted has an arrangement such as the one shown in FIG. 13.

Such processing is essentially performed by selecting the dots that are to be deleted from among the plurality (prescribed number a) of dots, and the processing is therefore simple even when the nozzle discharge information is complex. The arranged quantity for a prescribed region can also be easily managed by specifying the total number (prescribed number b) of dots that are to be deleted.

The processing in steps S11 through S14 described above is actually performed for each of the plurality of imaginary partitioned regions, whereby the liquid material is arranged with high precision in each partitioned region. The arranged quantity of the liquid material may also be varied between partitioned regions as a configuration in which the number of dots (prescribed number b) to be deleted is independently set for each imaginary partitioned region.

As described above, a dot that is to be deleted is selected based on the rating (indicator) of the dot, but an absolute reference value for a rating does not necessarily exist for selection, and selection is performed according to a relative comparison among 24 dots that are set for each of the imaginary partitioned regions A1, A2, A3, . . . . Therefore, the most suitable effects possible under limited conditions can be obtained in relation to enhancing the arrangement accuracy of the liquid material.

In the embodiment described above, the processing in steps S11 through S13 is performed for all of the dots 1 through 24, but this processing may be omitted for some of the dots. For example, it may be assumed that overflow will not occur as a result of discharge for eight dots (the $6^{th}$, $7^{th}$, $10^{th}$, $11^{th}$, $14^{th}$, $15^{th}$, $18^{th}$, and $19^{th}$ dots) that are set in positions near the center, and computation of the nearest-neighbor distance may be omitted.

Six (prescribed number b) dots were deleted from 24 (prescribed number a) dots in the embodiment described above, but the values of the prescribed number a and the prescribed number b may be appropriately modified according to the size of the partitioned regions 6, the pitch (resolution) of the matrix MT, the intended arrangement quantity, the quantity of droplets per dot, and other characteristics.

Second Embodiment

Referring now to FIGS. 9, 14, 15, and 16, a liquid material arrangement method in accordance with a second embodiment will now be explained with emphasis on the differences between the first and second embodiments. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

FIG. 14 is a flowchart showing the routines for generating the second dot pattern. FIG. 15 is a diagram showing the ratings for each dot. FIG. 16 is a diagram showing the arrangement of dots in the second dot pattern.

In the second embodiment, the second dot pattern is generated according to the flowchart shown in FIG. 14. Specifically, in the first step S21, the error (estimated error in a discharge quantity) or variation of the discharge quantity when discharge is assumed to be performed based on a dot is computed for each dot that is set within the imaginary partitioned regions A1, A2, A3, . . . . The discharge quantity error is calculated as the difference between a reference quantity (the value assumed from setting of the discharge quantity, or the average discharge quantity of a plurality of nozzles) and the discharge quantity of the corresponding nozzle.

The discharge quantity for each nozzle is measured in the nozzle check (step S2 of FIG. 7) performed previously. Specifically, the discharge quantity of each nozzle can be measured by measuring the volume of droplets arranged on the substrate in three dimensions using a white interference method, or measuring the size (surface area) of the landing mark of a droplet that is discharged to a paper, for example.

In the subsequent step S22, a rating for each dot is determined based on the discharge quantity error acquired in step S21. Since a large discharge quantity error indicates that a quantity of droplets that significantly differs from the reference quantity is being arranged in the partitioned regions, the determined rating is relatively small (the indicator is high) (see FIG. 15).

In the subsequent step S23, six (prescribed number b) dots (an example of a second prescribed number of dots) for which the rating is determined to be relatively small are deleted from the 24 (prescribed number a) dots (an example of a first prescribed number of dots) in the imaginary partitioned regions A1, A2, A3, . . . , and the second dot pattern is generated. When droplets (liquid material) are arranged based on the second dot pattern, since dots having a relatively large discharge quantity error are limited with priority, the accuracy of the arranged quantity can be enhanced.

In the case of the imaginary partitioned region A2 in the present embodiment, six dots in the order of the smallest rating (highest indicator), i.e., the $17^{th}$ through $20^{th}$ dots, and two dots among the $5^{th}$ through $8^{th}$ dots are deleted. The ratings for the $5^{th}$ through $8^{th}$ dots have the same value, but in such cases, the dots to be deleted are selected at random from among equivalent dots, for example. The arrangement of the second dot pattern thus generated is as shown in FIG. 16, for example.

Modified Example

A modified example of the second embodiment of the present invention will next be described with reference to FIGS. 17 and 18 with emphasis on the differences between the modified example and the previously described embodiment.

FIG. 17 is a diagram showing the ratings for each dot. FIG. 18 is a diagram showing the arrangement of dots in the second dot pattern.

In this modified example, the polarity (plus/minus) of the discharge quantity error is considered in determining the rating (indicator). Specifically, the determined indicator increases (the rating decreases) in relative fashion the larger the absolute value of the discharge quantity error is between dots for which the polarity (plus/minus) of the discharge quantity error is the same, but the same phenomenon does not necessarily occur between dots having different polarities.

For example, in the case of the imaginary partitioned region A2 (see FIG. 17), the rating is 1 for the $17^{th}$ through $20^{th}$ dots, for which the discharge quantity error is +0.22, as in the previous embodiment, but the determined rating is 2 for the $1^{st}$ through $4^{th}$ dots, for which the discharge quantity error is −0.14, and the determined rating is 3 for the $5^{th}$ through $8^{th}$ dots, for which the discharge quantity error is +0.15. The $5^{th}$ through $8^{th}$ dots, and two of the $1^{st}$ through $4^{th}$ dots are deleted, and the arrangement of dots in the second dot pattern is as shown in FIG. 18, for example.

In the previously described embodiment, since the ratings (indicators) were determined with consideration only for the absolute value of the discharge quantity error, only dots for which the discharge quantity was large in relation to the reference quantity were deleted, and when the liquid material was arranged based on the second dot pattern, drawbacks occurred whereby the quantity of the liquid material arranged in the partitioned regions was disproportionately small. In the present modified example, such problems are prevented by adopting a determination reference whereby the sequence of ratings (error indicators) alternates in relation to the polarity of the discharge quantity error.

Third Embodiment

Referring now to FIGS. 19 and 20, a liquid material arrangement method in accordance with a third embodiment will now be explained with emphasis on the differences between the second and third embodiments. In view of the similarity between the second and third embodiments, the parts of the third embodiment that are identical to the parts of the second embodiment will be given the same reference numerals as the parts of the first embodiment. Moreover, the descriptions of the parts of the third embodiment that are identical to the parts of the second embodiment may be omitted for the sake of brevity.

FIG. 19 is a diagram showing the ratings for each dot. FIG. 20 is a diagram showing the arrangement of dots in the second dot pattern.

In the third embodiment, the ratings (error indicators) are determined based on the discharge quantity error described in the second embodiment, and the relative positioning of dots with respect to the secondary scanning direction. Specifically, a rating B is determined according to Table 1 based on the discharge quantity error, a rating C is determined according to Table 2 based on the relative positioning of dots with respect to the secondary scanning direction, and a total rating is determined as the sum of rating B and rating C (see FIG. 19).

TABLE 1

| Discharge Quantity Error (Absolute Value) | Rating B |
|---|---|
| 0.20 or higher | 1 |
| 0.10 or greater but less than 0.20 | 2 |
| less than 0.10 | 3 |

TABLE 2

| Relative Positioning Of Dots With Respect To The Secondary Scanning Direction | Rating C |
|---|---|
| Center Column ($9^{th}$ Through $16^{th}$) | 1 |
| Quasi-Outer Column ($5^{th}$ Through $8^{th}$, $17^{th}$ Through $20^{th}$) | 1.5 |
| Outer Column ($1^{st}$ Through $4^{th}$, $21^{st}$ Through $24^{th}$) | 2 |

It is preferred that the liquid material spread into all areas of the partitioned region without deficiencies in order to achieve satisfactory patterning, but defects from such a perspective can be considered to be more likely to occur in discharging of droplets (liquid material) based on center-column dots than in discharging of droplets (liquid material) based on outer-column dots. The reason for this is that flaws in the liquid material are generally more likely to occur in locations near the end parts of the partitioned regions than in locations near the center, although leakage properties in the partitioned regions and the surface tension of the liquid material are also factors. In other words, arranging the droplets with priority in locations near the center is more likely to cause such defects. The ratings (error indicators) are determined based on the relative positioning of dots with respect to the secondary scanning direction in view of such circumstances, and the determined rating of a dot is smaller (the error indicator is higher) the closer the relative positioning of the dot is to the center with respect to the secondary scanning direction.

In the case of the imaginary partitioned region A2 (see FIG. 19), the $17^{th}$ through $20^{th}$ dots, and two of the $13^{th}$ through $16^{th}$ dots are deleted, and the arrangement of the second dot pattern thus generated is as shown in FIG. 20, for example.

Fourth Embodiment

Figures 21, 22:
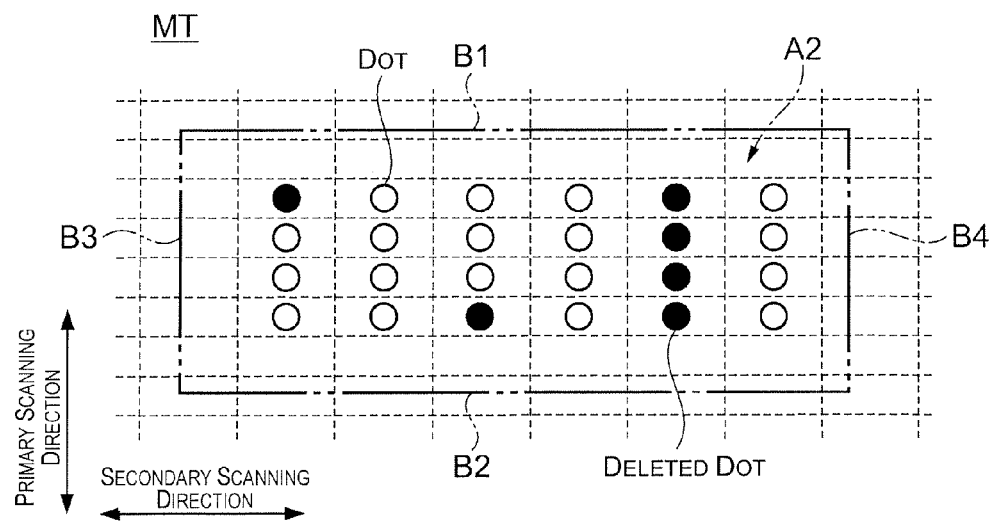
FIG. 21 is a diagram showing the ratings for each dot.
FIG. 22 is a diagram showing the arrangement of dots in the second dot pattern.

Referring now to FIGS. 21 and 22, a liquid material arrangement method in accordance with a fourth embodiment will now be explained with emphasis on the differences between the first, third and fourth embodiments. In view of the similarity between the first, third and fourth embodiments, the parts of the fourth embodiment that are identical to the parts of the first or third embodiment will be given the same reference numerals as the parts of the first or third embodiment. Moreover, the descriptions of the parts of the fourth embodiment that are identical to the parts of the first or third embodiment may be omitted for the sake of brevity.

FIG. 21 is a diagram showing the ratings for each dot. FIG. 22 is a diagram showing the arrangement of dots in the second dot pattern.

In the fourth embodiment, in addition to rating B and rating C described in the third embodiment, a rating A is determined according to Table 3 based on the nearest-neighbor distance between the boundary of the imaginary partitioned region and the landing position coordinates of the imaginary droplet described in the first embodiment, and a total rating is determined as the total value of the ratings A, B, and C (see FIG. 21).

TABLE 3

| Nearest-Neighbor Distance | Rating A |
|---|---|
| Less Than 18 | 1 |
| 18 Or Higher | 3 |

In the case of the imaginary partitioned region A2 (see FIG. 21), the $1^{st}$, $12^{th}$, and $17^{th}$ through $20^{th}$ dots are deleted, and the arrangement of dots in the second dot pattern is as shown in FIG. 22.

When a rating (total rating) is determined based on a plurality of parameters as in the third and fourth embodiments, the weighting between parameters can be appropriately modified. For example, when a configuration is adopted in which the rating B is determined according to Table 4, the weight of the total rating determination that is based on the discharge quantity error is relatively small, and dots for which the nearest-neighbor distance is small are deleted with higher priority than dots for which the discharge quantity error is large.

TABLE 4

| Discharge Quantity Error (Absolute Value) | Rating B |
|---|---|
| 0.20 Or Higher | 1 |
| 0.10 Or Greater But Less Than 0.20 | 1.5 |
| Less Than 0.10 | 2 |

Fifth Embodiment

Referring now to FIG. 23, a liquid material arrangement method in accordance with a fifth embodiment will now be explained with emphasis on the differences between the first and fifth embodiments. In view of the similarity between the first and fifth embodiments, the parts of the fifth embodiment that are identical to the parts of the first embodiment will be given the same reference numerals as the parts of the first embodiment. Moreover, the descriptions of the parts of the fifth embodiment that are identical to the parts of the first embodiment may be omitted for the sake of brevity.

FIG. 23 is a sectional view showing the relevant parts of the structure of the organic EL display device.

As shown in FIG. 23, the organic EL display device 100 is provided with an element substrate 111, a drive circuit part 112 formed on the element substrate 111, a luminescent element part 113 formed on the drive circuit part 112, and a sealing substrate 114 for sealing the drive circuit part 112 and the luminescent element part 113. The sealed space 115 that is sealed by the sealing substrate 114 is filled with an inert gas.

The luminescent element part 113 has a plurality of partitioned regions 119 that is partitioned by banks 120, and luminescent elements 125 are formed in the partitioned regions 119. In the luminescent elements 125, a positive hole transport layer 122 and an organic EL material layer 123 are layered between a shared electrode (cathode) 124 and a segment electrode (anode) 121, which is the output terminal of the drive circuit part 112. A light-blocking film 126 for preventing interference between contrast elements is formed from chromium, an oxide thereof, or the like between the banks 120 and the drive circuit part 112.

The positive hole transport layer 122 is a functional layer for introducing a positive hole into the organic EL material layer 123, and is formed using a doped polythiophene derivative (PEDOT) or other polymer derivative. The organic EL material layer 123 is formed using a publicly known organic EL material that is capable of fluorescence or phosphorescence, e.g., a polyfluorene derivative, a (poly)paraphenylene vinylene derivative, a polyphenylene derivative, or the like. The positive hole transport layer 122 and the organic EL material layer 123 are manufactured by using the liquid material arrangement method described in the first embodiment to arrange a liquid material that includes the corresponding functional material (PEDOT/organic EL material) in the partitioned regions 119 as the prescribed regions.

The present invention is not limited by the embodiments described above.

Other examples in which the abovementioned liquid material arrangement method is used include the formation of a fluorescent film in a plasma display device, the formation of conduction wiring or resistance elements in an electrical circuit, and other examples.

The configurations described in the embodiments may also be appropriately combined, omitted, or combined with other configurations not shown in the drawings.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified teem if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A liquid material arrangement method for arranging a liquid material in each of a plurality of units of prescribed region on a substrate by discharging the liquid material as a droplet from a nozzle, the liquid material arrangement method comprising:
   performing a discharge information acquiring step for acquiring discharge information of the nozzle including a landing position and a discharge quantity of the droplet discharged from the nozzle by a nozzle check;
   performing a second pattern generating step for generating a second dot pattern, which is an arrangement pattern for arranging a prescribed number of droplets, by selecting at least one non-discharge dot from a first dot pattern, which is an arrangement pattern for arranging more droplets than the prescribed number of droplets, based on the discharge information and by deleting the non-discharge dot from the first dot pattern for all of the units of the prescribed region; and
   performing a liquid material arranging step for arranging the liquid material in each of the units of the prescribed region based on the second dot pattern,
   a number of the selected non-discharge dot being the same for each of the units of the prescribed region.

2. The liquid material arrangement method according to claim wherein
   the performing of the second pattern generating step includes selecting the non-discharge dot by determining the discharge information respectively for each of the units of the prescribed region.

3. The liquid material arrangement method according to claim 1, wherein
   the units of the prescribed region are partitioned by banks.

4. A color filter manufacturing method comprising:
   performing the liquid material arrangement method according to claim 1 to discharge a plurality of color materials as the liquid material onto the prescribed regions on the substrate, respectively; and curing the arranged liquid material to form a plurality of colored parts in the units of the prescribed region with each of the colored parts corresponding to a pixel region.

5. An organic EL display device manufacturing method comprising:

performing the liquid material arrangement method according to claim 1 to discharge an organic EL material as the liquid material onto the units of the prescribed region of the substrate, respectively; and curing the arranged liquid material to form luminescent elements in the units of the prescribed region with each of the luminescent elements corresponding to a pixel region.

* * * * *